US012646905B2

(12) United States Patent
Scofield et al.

(10) Patent No.: US 12,646,905 B2
(45) Date of Patent: Jun. 2, 2026

(54) INTEGRATED REDUCED-COHERENCE-LENGTH LASER

(71) Applicant: ROCKLEY PHOTONICS LIMITED, Altrincham (GB)

(72) Inventors: Adam Scofield, Los Angeles, CA (US); Yi Zhang, Pasadena, CA (US); Aaron John Zilkie, Pasadena, CA (US); Andrea Trita, Pasadena, CA (US)

(73) Assignee: Rockley Photonics Limited, Altrincham (GB)

( * ) Notice: Subject to any disclaimer, the term of this patent is extended or adjusted under 35 U.S.C. 154(b) by 573 days.

(21) Appl. No.: 18/194,845

(22) Filed: Apr. 3, 2023

(65) Prior Publication Data

US 2023/0327403 A1 Oct. 12, 2023

Related U.S. Application Data

(60) Provisional application No. 63/328,529, filed on Apr. 7, 2022.

(51) Int. Cl.
*H01S 5/065* (2006.01)
*H01S 5/20* (2006.01)

(52) U.S. Cl.
CPC .......... *H01S 5/0652* (2013.01); *H01S 5/2027* (2013.01)

(58) Field of Classification Search
None
See application file for complete search history.

(56) References Cited

U.S. PATENT DOCUMENTS

| | | | |
|---|---|---|---|
| 9,118,165 B1 * | 8/2015 | Norberg | .............. H01S 3/08027 |
| 9,804,027 B2 | 10/2017 | Fish et al. | |
| 10,684,114 B2 | 6/2020 | Li et al. | |
| 2018/0331500 A1 * | 11/2018 | Cheung | ................. H01S 5/4068 |

OTHER PUBLICATIONS

Solehmainen, K. et al., "Adiabatic and Multimode Interference Couplers on Silicon-on-Insulator", IEEE Photonics Technology Letters, Nov. 1, 2006, 4 pages, vol. 18, No. 21, IEEE.

* cited by examiner

*Primary Examiner* — Kristy A Haupt
(74) *Attorney, Agent, or Firm* — Womble Bond Dickinson (US) LLP

(57) ABSTRACT

The present invention provides a laser comprising a laser cavity defined by a first reflector and a second reflector. The laser cavity comprising a gain region and an intracavity modulation stage for reducing coherence of the laser output. The intracavity modulation stage comprises a region configured to support a plurality of optical modes. The second reflector is a broadband reflector having a reflectance spectrum configured to support the plurality of optical modes.

20 Claims, 10 Drawing Sheets

260

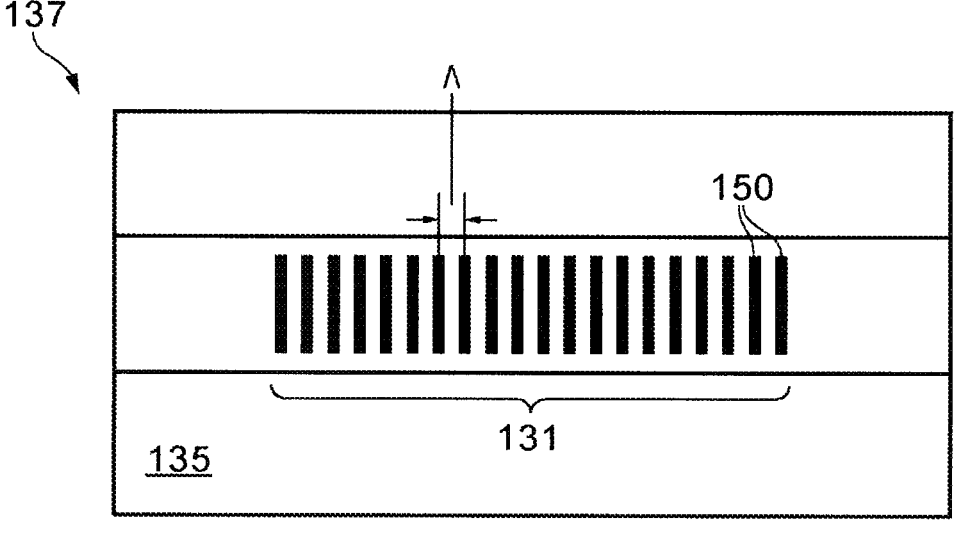
FIG. 3
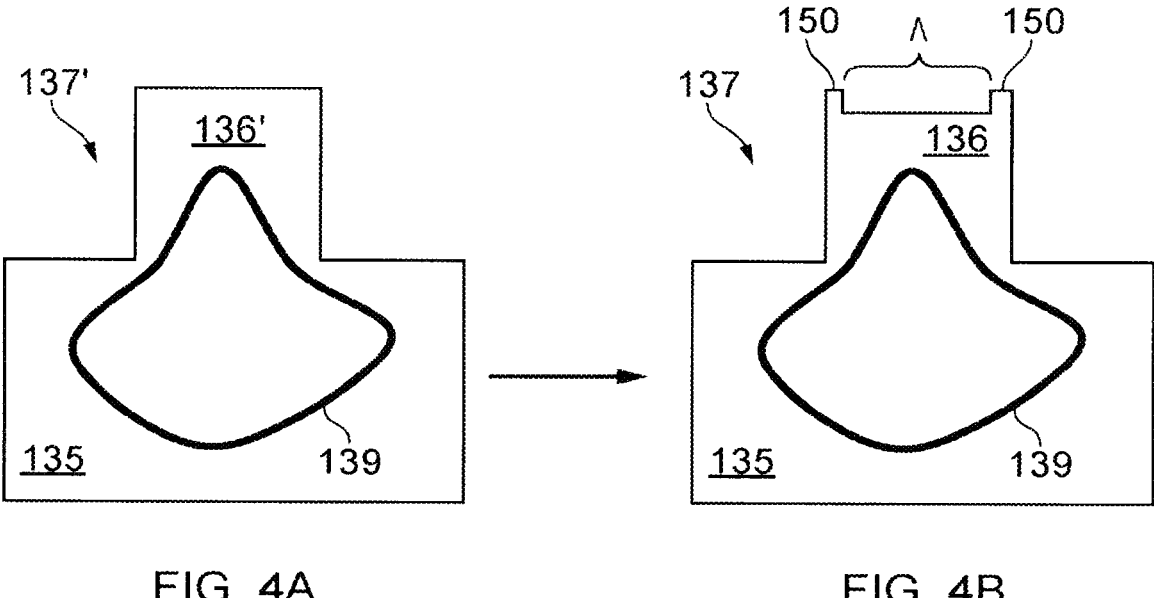
FIG. 4A                    FIG. 4B

FIG. 8A                          FIG. 8B

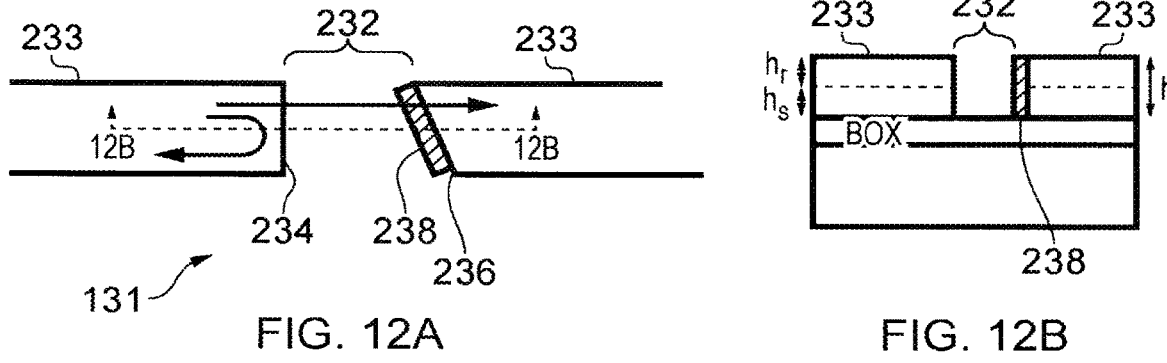
FIG. 12A
FIG. 12B
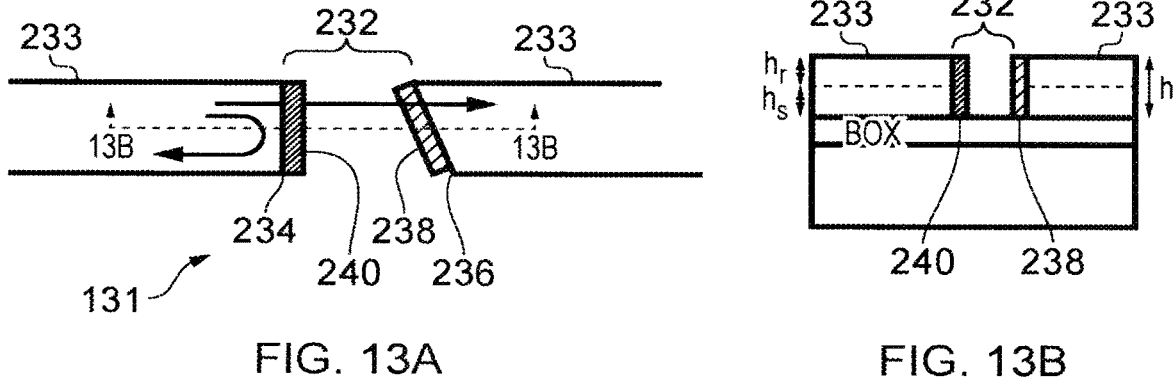
FIG. 13A
FIG. 13B

INTEGRATED
REDUCED-COHERENCE-LENGTH LASER

CROSS-REFERENCE TO RELATED APPLICATION(S)

The present application claims priority to and the benefit of U.S. Provisional Application No. 63/328,529, filed Apr. 7, 2022, entitled "INTEGRATED REDUCED-COHERENCE-LENGTH LASER", the entire content of which is incorporated herein by reference.

FIELD

One or more aspects of embodiments according to the present invention relate to a laser, and more particularly to a laser with an intracavity modulation stage for reducing coherence of the laser output.

BACKGROUND

Highly coherent laser sources are important to many applications in communications and sensing (e.g. Lidar) as laser coherence influences the distance over which the laser light is useful for these applications. Thus, conventional silicon photonics lasers are commonly designed as highly coherent, single-mode lasers.

Within the field of silicon photonics, lasers incorporating Distributed Bragg Reflectors (DBRs) are known. In such lasers, a DBR grating is usually designed such that its reflectance spectrum overlaps with only a single optical mode of the laser cavity. Thus, the DBR grating only supports a single optical mode, while suppressing the remaining optical modes. Other types of reflectors can be used instead of a DBR grating to achieve the same effect. Generally, reflectors having a narrow reflectance spectrum, usually with a full-width half-maximum (FWHM) of much less than 1 nm, can be used to achieve this type of single-mode lasing.

However, when used to perform spectroscopy of tissues and other highly scattering media, highly coherent laser sources such as the ones described above, can produce speckle patterns and increased measurement noise, thereby degrading the performance of the spectroscopy system. One way to address this issue is to use a laser source having a reduced coherence length.

SUMMARY

The present invention has been devised in light of the above considerations. Furthermore, it has been realized that it is desirable to provide a laser source having an emission spectrum at least as broad as a corresponding sample interval in wavelength, and further having a uniform/flat, or substantially uniform/flat power spectrum.

In a first aspect, some embodiments of the present invention provide a laser comprising a laser cavity defined by a first reflector and a second reflector, the laser cavity comprising:

a gain region;

an intracavity modulation stage for reducing coherence of the laser output, the intracavity modulation stage comprising a region configured to support a plurality of optical modes; and the second reflector is a broadband reflector having a reflectance spectrum configured to support the plurality of optical modes.

Advantageously, the intracavity modulation stage and the broad reflectance spectrum of the second reflector together ensure multi-mode laser operation. Thus, the laser emission spectrum is broadened in wavelength and the laser coherence length is reduced, thereby avoiding challenges associated with highly coherent single-mode laser sources such as the ones discussed above.

Optional features of some embodiments of the present invention are outlined below. These are applicable singly or in combination with each other except where such a combination is clearly impermissible or expressly avoided.

In addition to the second reflector, the first reflector may also be a broadband reflector. The first reflector may have a reflectivity of 90% or more, e.g. 95%.

In one or more embodiments, the gain region may comprise a semiconductor optical amplifier (SOA).

Optionally, the SOA(s) may comprise the first reflector such that it functions as a Reflective SOA (RSOA). The RSOA may have a flat gain spectrum. The RSOA gain spectrum and/or the reflectance spectrum of the broadband reflector may be configured for a center wavelength emission in the range 400-2400 nm, and more preferably a center wavelength emission of around 1550 nm.

Optionally, the gain region may be a region of III-V material. Alternatively, the gain region may be formed of another non-silicon material.

Optionally, the intracavity modulation stage may comprise a delay line. In effect, the delay line acts to spatially extend the laser cavity to allow for the development and support of the plurality of optical modes therein. Conveniently, the delay line may reduce the wavelength separation of the plurality of optical modes, e.g. such that the optical modes are closely spaced and/or have similar or substantially equal power.

Optionally, delay line may be a silicon waveguide. Alternatively, the delay line may be a waveguide formed of a different waveguide material, for example SiN.

Optionally, the delay line may be a waveguide with an undulating path. The undulating path may form a serpentine shape. The path may be arranged to maximize the pathlength of the waveguide over a given portion of real estate on a photonic chip (e.g. an SoI chip).

Optionally, the intracavity modulation stage may further comprise a phase shifter for dynamically shifting the wavelengths of the plural optical modes. In this way, the overlap between the plurality of optical modes and the reflectance spectrum of the broadband reflector can be improved.

The phase shifter may be provided downstream of the gain region (e.g. downstream of the delay line), and/or upstream of the broadband reflector, e.g. the phase shifter may be located between the delay line and the broadband reflector, such that it receives output from the phaser shifter and outputs to the broadband reflector to provide the laser output. Alternatively, the phase shifter may be provided in the vicinity of the gain region, e.g. upstream of the delay line. For example, the phase shifter may be provided by the RSOA when a small signal modulation is applied. Thus, the phase shifter can sweep the optical modes supported by the laser cavity over a full cavity free spectral range (FSR) to actively modulate the intracavity phase. Preferably, the time it takes the phase shifter to shift the wavelengths of the optical modes is shorter than an integration time of a receiver of the laser output. In this way, the phase shifter can enable broadband multi-mode laser operation when averaged over the integration time of the receiver.

Optionally, the phase shifter may comprise a heater. Additionally or alternatively, the phase shifter may comprise a semiconductor junction. For example, the semiconductor junction may be a p-i-n junction. The phase shifter may comprise any type of semiconductor junction configured to alter material properties in such a way that induces a phase shift upon application of an electrical current.

Optionally, the broadband reflector may be a grating, the grating being configured to reflect over a range of wavelengths (e.g. 1 micron).

The grating may be a waveguide grating comprising a plurality of waveguides spaced by a grating period, Λ. The plurality of waveguides may be formed of e.g. a single rib or strip waveguide, e.g. by etching the rib/strip waveguide. For example, the rib/strip waveguide may be etched such that a topmost portion (distal a base (slab portion) of the waveguide) is etched in a direction towards the base (slab portion) of the waveguide to provide plural corrugations, thereby forming the waveguide grating. Conveniently, using a strip waveguide to form the grating can achieve a wider grating bandwidth.

Optionally, the grating may be a DBR grating. Conveniently, the DBR grating may be specifically designed for a high coupling constant, κ (kappa). Thus, the DBR grating may have a reflectance spectrum with a FWHM greater than about 1 nm. Such a FWHM can ensure multi-mode laser operation.

Optionally, the grating may have a chirped grating period, e.g. to broaden and flatten the grating reflectance spectrum. In this way, the reflectance spectrum may advantageously follow a rectangular or substantially rectangular profile instead of a Gaussian profile. The chirped grating may be implemented with a linearly or nonlinearly varying grating period, Λ, over the length of the grating. Alternatively, the grating may be implemented with N sections of substantially constant grating period, $Λ_i$, each grating period $Λ_i$ having a slightly different value from those in its respective neighboring sections. In this case, the grating may be referred to as a multi-section grating.

The reflectance spectrum of the grating may be in the shape of a brick wall filter, e.g. having a filter width comparable to a channel spacing of a spectrometer configured for reception of the laser output.

Alternatively, the broadband reflector may be a waveguide comprising a transverse slot. The waveguide may be a rib or a strip waveguide. At the slot, a first waveguide end or "facet" may be square, and a second waveguide end or "facet" may be angled, i.e., oblique to the waveguide. The oblique angle of the second waveguide end may prevent reflections from the second waveguide end from coupling back into the laser cavity. Conveniently, these configurations can create a discontinuity in the diffraction index at the first waveguide end to cause light to be reflected back into the laser cavity. The first waveguide end may have a coating that may be a single or multi-layer thin film dielectric coating, or a metal coating, to adjust the reflectance of the broadband reflector. A dielectric thin film anti-reflection coating may be formed on the second waveguide end to reduce loss. The slot may be filled with a material having a pre-selected refractive index to control the reflectivity of the broadband reflector.

Optionally, the laser may be configured such that a plurality of gain regions feed into the intracavity modulation stage, which is a shared intracavity modulation stage. The plurality of gain regions may be located within the same photonic integrated chip (PIC). That is to say, the PIC is a multi-laser PIC. The plurality of gain regions may be selected to lase at different wavelengths from one another, across a range of (e.g. different) wavelengths within the reflectance spectrum of the broadband reflector, which may be a shared broadband reflector. In some examples, light from more than one of the plurality of gain regions may be guided by a shared waveguide, e.g. to a multiplexer.

In some examples, the laser emission spectrum (which is determined by the range of wavelengths of the gain region(s) and by the reflectance spectrum of the broadband reflector) may as broad as 1000 nm in wavelength.

In one or more embodiments, the broadband reflector is therefore configured to reflect light from a plurality of input wavelengths arising from the plurality of gain sources that share the intracavity modulation stage.

Optionally, light from the plurality of gain regions may be multiplexed to the broadband reflector by a multiplexer. Conveniently, by multiplexing light from the plurality of gain regions, the phase of the multiplexed output can be efficiently shifted as required by a single phase shifter, instead of requiring a phase shifter for each individual gain region. Thus, the footprint of the phase shifter on the PIC can be reduced.

Optionally, the multiplexer may be an Echelle grating, the Echelle grating also acting as a wavelength filter. The Echelle grating may be configured such that the shape of the square of its channel transmission spectrum translates to a loss spectrum profile of the laser cavity, therefore producing a broader and flatter laser emission spectrum, similarly to the effect achieved by the DBR grating of the examples above. The passband of the Echelle grating may be configured to match a reflectance spectrum of the broadband reflector having a FWHM greater than about 1 nm, and more preferably greater than about 3 nm. In some examples, the Echelle grating may include a Mach-Zehnder interferometer (MZI) output for a flat-top passband. Alternative optical components may be used instead of an Echelle grating, for example, the multiplexer may be an arrayed waveguide grating (AWG).

A mode suppression of the hybrid laser may be no more than 30 dB, or no more than 20 dB, or no more than 10 dB. Conveniently, a mode suppression of such magnitude can ensure mode partition and therefore multi-mode laser operation, as well as a more uniform power distribution among the plurality of optical modes.

The laser may be a hybrid laser, i.e. a laser comprising two or more materials (i.e. a non-monolithic laser). For example, the hybrid laser may comprise a PIC of a first material and a gain region of a second (different) material. The first material may be silicon. The second material may be a III-V semiconductor material.

In a second aspect, some embodiments of the present invention provide a silicon photonics integrated circuit comprising the laser of the first aspect and optionally any one or more of the optional features set out above.

BRIEF DESCRIPTION OF THE DRAWINGS

These and other features and advantages of the present invention will be appreciated and understood with reference to the specification, claims, and appended drawings wherein:

FIG. 3 schematically shows a grating formed of a rib waveguide;

FIGS. 4A-4B schematically show an optical mode respectively in an un-etched rib waveguide and in a rib waveguide etched to provide the grating of FIG. 3;

FIG. 8A-8B schematically show an optical mode respectively in an un-etched strip waveguide and in a strip waveguide etched to provide the grating of FIG. 7;

FIG. 12A is a top view of a broadband reflector which is a waveguide comprising a transverse slot;

FIG. 12B is a cross-sectional view, along the line 12B-12B, of the broadband reflector of FIG. 12A;

FIG. 13A is a top view of a variant of the broadband reflector of FIG. 12A;

FIG. 13B is a cross-sectional view, along the line 13A-13A, of the broadband reflector of FIG. 13A;

DETAILED DESCRIPTION

Figure 1:
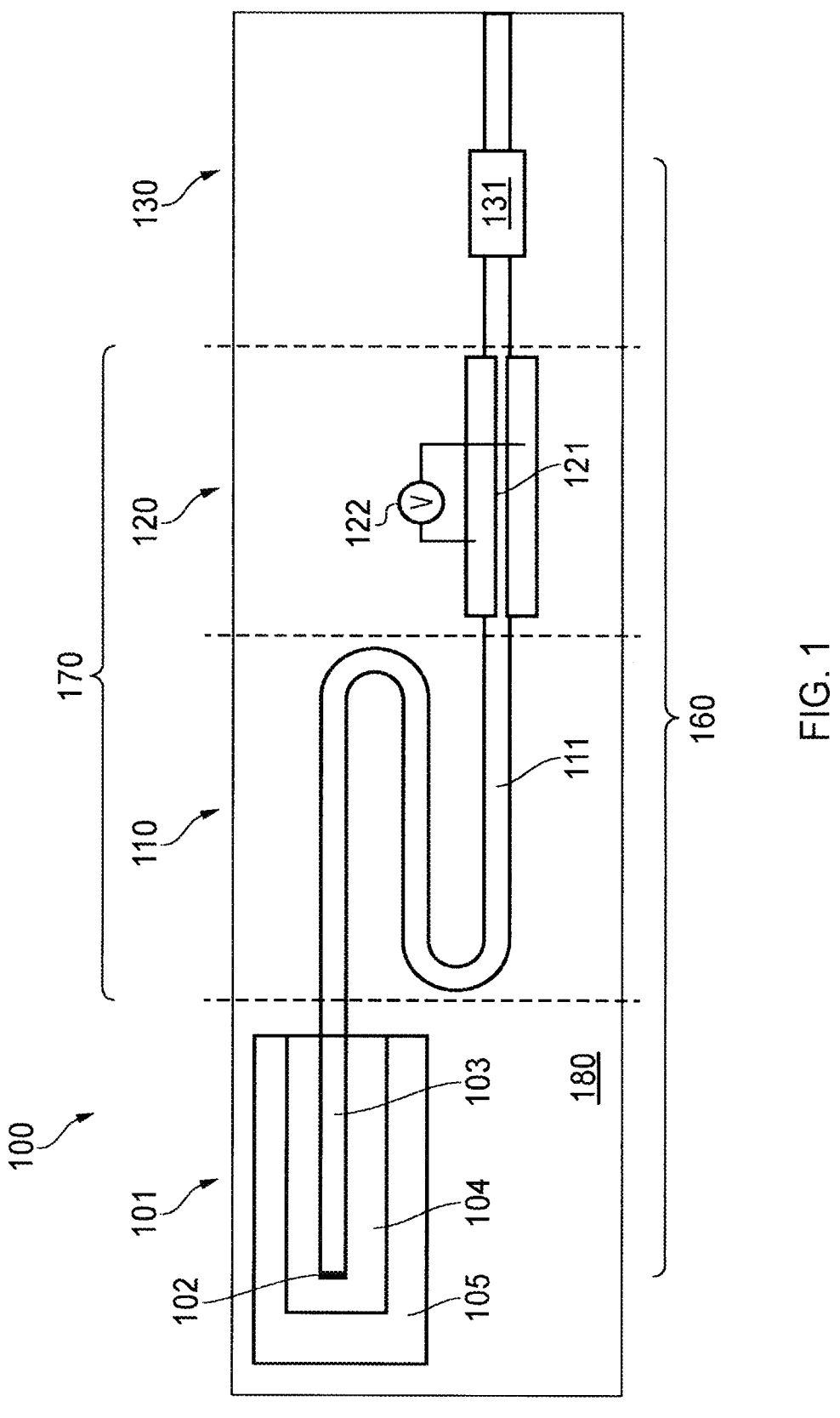
FIG. 1 schematically shows a laser including a broadband reflector.

The detailed description set forth below in connection with the appended drawings is intended as a description of exemplary embodiments of a laser with an intracavity modulation stage for reducing coherence of the laser output, provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

A first embodiment of a laser 100 is described below with reference to FIG. 1 The laser 100 comprises a laser cavity 160 defined by a first reflector 102 and a second reflector 131. The laser cavity includes a gain region 101. The laser in this example is a hybrid laser such that it comprises a PIC 180 and a gain region 101 formed of different materials. The gain region 101 comprises an optical amplifier 103 for providing the laser gain. In this example, the optical amplifier 103 is a semiconductor optical amplifier (SOA) such as a SOA waveguide. The SOA 103 may be formed of e.g. III-V semiconductor or any other suitable gain material. The PIC 180 may be formed on a silicon-on-insulator platform. Waveguides may be formed from silicon.

The laser 100 comprises a gain chip 104, e.g. a III-V semiconductor chip. The gain chip 104 may be located in a cavity 105, the cavity being formed in the PIC 180. Here, the SOA 103 comprises the first reflector 102 such that the SOA functions as a reflective SOA (i.e. an RSOA). That is, the first reflector 102 is a highly reflective surface within the gain chip 104. In the examples of FIGS. 1 and 11, the reflective surface is formed by coating an end facet of the SOA waveguide 103 with a highly reflective (HR) coating, i.e. having a reflectivity of 90% or more, e.g. 95%. The RSOA 103 may be optimized to have a flat gain spectrum, e.g. configured for a center wavelength emission in the range 400-2400 nm, and more preferably a center wavelength emission of around 1550 nm.

Next, the laser 100 comprises an intracavity modulation stage 170 for reducing coherence of the laser output. In the embodiment shown, the intracavity modulation stage 170 comprises a delay region 110 configured to support a plurality of optical modes, and a phase shifter region 120 configured to sweep the plurality of optical modes over the full FSR of the laser cavity 160. In this example the delay region 110 includes a delay line 111 which is realized as a waveguide. For example, the waveguide 111 may be a semiconductor (such as Si) waveguide. In some examples, the delay line 111 is a waveguide with an undulating path. In the embodiment shown, the undulating path has a serpentine shape. The curves of the serpentine result in an optimization of the path length of the waveguide over a given piece of chip real estate.

The delay line 111 acts to spatially extend the laser cavity 160 to allow for the development and support of the plurality of optical modes therein. In this example, the delay line 111 has a length of 4 mm. Conveniently, the delay line 111 may reduce the wavelength separation of the plurality of optical modes, e.g. such that the optical modes are closely spaced.

The phase shifter region 120 comprises a phase shifter 121. In the examples of FIGS. 1 and 11, the phase shifter 121 is provided downstream of the delay line(s) 111, as a p-i-n semiconductor junction. Modifications are possible. For example, other types of junctions may be used to achieve phase shifting. Alternatively, phase shifting may be realized by applying a bias current across the laser cavity 160 and/or by including a heater. It is also possible that the phase shifter 121 be provided by the RSOA 103 when a small signal modulation is applied.

The phase shifter 121 sweeps the optical modes supported by the laser cavity 160 over the FSR of the cavity to actively modulate the intracavity phase. Thus, the overlap between the plurality of optical modes and the reflectance spectrum of the second reflector 132 is improved. Preferably, the time it takes the phase shifter 121 to shift the wavelengths of the optical modes is shorter than an integration time of a receiver of the laser output (not shown). In this way, the phase shifter 121 can enable broadband multi-mode laser operation when averaged over the integration time of the receiver.

The second reflector 131 is located in a region 130 downstream of the intracavity modulation stage 170. The second reflector 131 is broadband reflector having a reflectance spectrum configured to support the plurality of optical modes developed by the delay line 111. The broadband reflector 131 may have a spectrum, e.g. configured for a center wavelength emission in the range 400-2400 nm, and more preferably a center wavelength emission of around 1550 nm.

The broadband reflector 131 may be a grating such as a DBR grating. A laser 100 having all features of the laser 100 of FIG. 1 and a DBR grating as a broadband reflector 131 is discussed with reference to FIG. 2. The DBR grating 131 comprises a plurality of waveguides 150 spaced by a grating period, $\Lambda$. The plurality of waveguides 150 are formed of e.g. a single rib 137 or strip 134 waveguide, e.g. by etching the rib/strip waveguide (discussed in more detail in FIGS. 3, 4A-4B, 7, 8A-8B). Preferably the plurality of waveguides 150 are formed of a strip waveguide 134 as this can achieve a wider grating bandwidth. Preferably, the DBR grating 131 is designed for a high coupling constant, $\kappa$. Thus, the DBR grating 131 of this example has a reflectance spectrum with a FWHM greater than about 1 nm. Such a FWHM ensures multi-mode laser operation.

In operation, light generated within the laser cavity 160 is optically coupled into the delay line 111. There, the plurality of optical modes develops over the length of the cavity 160. The plurality of optical modes is then supplied to the phase shifter 121 which sweeps the optical modes over the full FSR of the laser cavity 160 to optimize the overlap between the plurality of optical modes and the reflectance spectrum of the broadband reflector 131 (in this embodiment, the DBR). Finally, the phase-shifted optical modes are partially reflected by the DBR grating 131 such that a first portion of the light incident on the DBR grating is outputted from the laser 100 and a second portion of the light is returned to the laser cavity 160. Thus, the laser output is characterized by a reduced coherence length, and a broad and flat emission spectrum, which makes it particularly suitable e.g. for tissue spectroscopy applications.

An example of a grating 131 that can form part of one or more embodiments of the present invention is described below with reference to FIGS. 3, 4A and 4B. The grating 131 is formed of a rib waveguide 137 comprising a plurality of spaced waveguides 150. This grating 131 has a constant grating period, $\Lambda$. The rib waveguide has a slab portion 135 and a rib portion 136.

In the example shown in FIG. 4A, an optical mode 139 confined in an un-etched rib waveguide 137'; whereas in the example shown in FIG. 3B the rib waveguide of FIG. 3A which has been etched to provide the grating 131 of FIG. 3, thereby producing the waveguide 137 of FIG. 3. The waveguide 137 etched to provide plural corrugations (only one of which is shown), thereby forming the grating 131. The corrugation in this example spaces two of the plurality of waveguides 150 forming the grating 131 by the grating period $\Lambda$.

Figure 2:
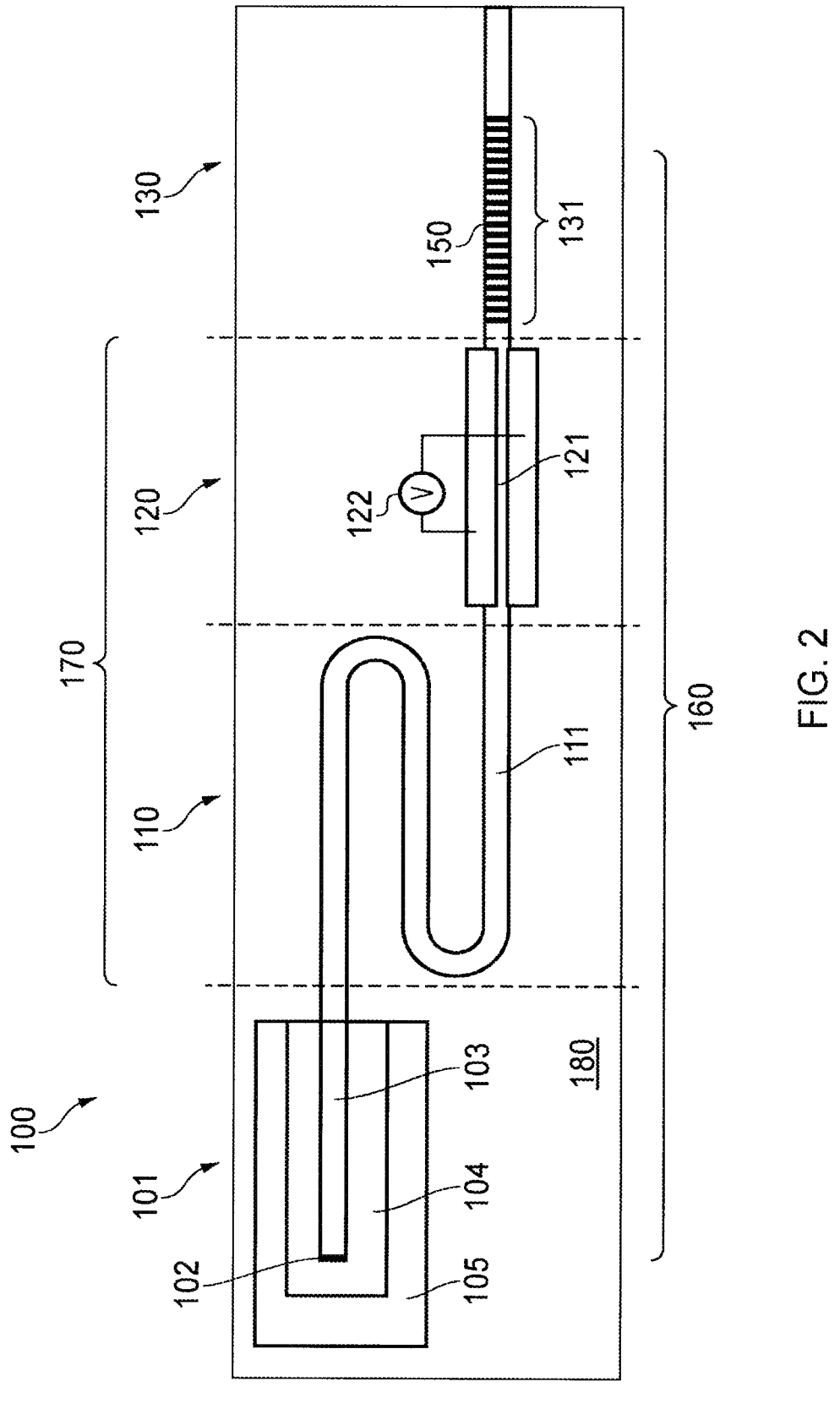
FIG. 2 schematically shows a variant of the laser of FIG. 1 where the broadband reflector includes a grating.
Figures 5, 6A, 6B:
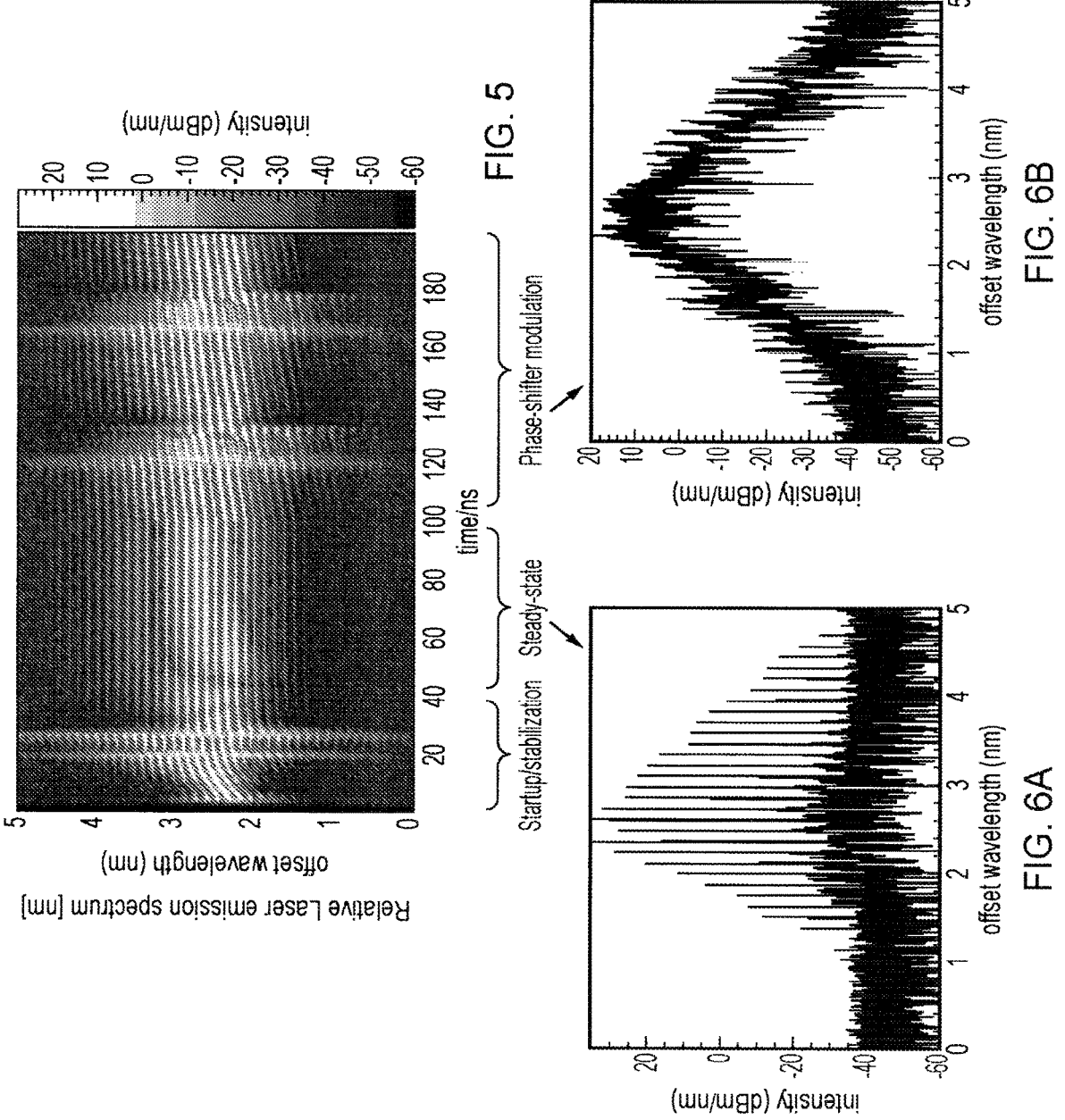
FIG. 5 shows a simulated time-evolution plot of a relative laser emission spectrum for a laser having the grating of FIG. 3.
FIGS. 6A-6B show snapshots in time of the relative laser emission spectrum of FIG. 5 respectively in the steady-state stage and in the phase-shifter modulation stage of laser operation.

FIG. 5 shows a simulated time-evolution plot of a relative laser emission spectrum for a laser 100 having the grating 131 of FIG. 2. The time evolution of laser operation includes three discernible laser operation stages—an initial startup/stabilization stage; a steady-state stage; and a phase-shifter modulation stage. The steady-state stage corresponds to when light travels through the delay line 111 to develop the multiple optical modes which are then steadily supported by the laser cavity 160. The phase shifter modulation stage corresponds to the when the light passes through the phase shifter region 120 such that the optical modes are swept over the full FSR of the cavity 160.

FIGS. 6A-6B show snapshots in time of the relative laser emission spectrum of FIG. 5 respectively in the steady-state stage and in the phase-shifter modulation stage. This clearly shows the effect of the phase shifter 121 on the laser emission spectrum. That is, the spectrum is flattened, the spacings between the optical modes are reduced and the optical modes are distributed more uniformly over a spectrum corresponding to the reflectance spectrum of the DBR grating 131.

A grating 131 formed by a strip waveguide 134 is described below with reference to FIGS. 7-8B. Conveniently, forming the grating 131 of a strip waveguide 134 can achieve a wider grating bandwidth. Similarly to the rib waveguide 137, the strip waveguide 134 comprises a slab portion 135 and a strip portion 151.

Figures 7, 9:
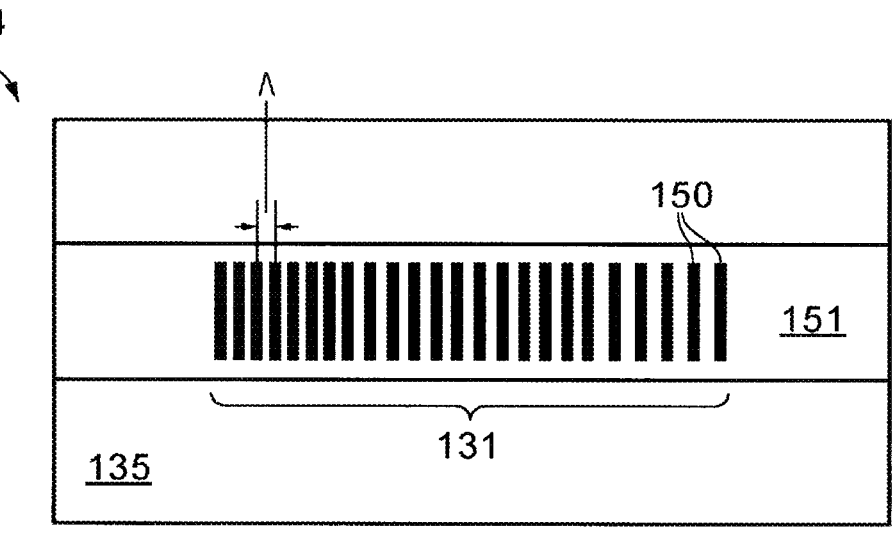
FIG. 7 schematically shows a grating formed of a strip waveguide.
FIG. 9 shows a plot of an idealized reflectance spectrum of the grating of FIG. 7 having a chirped grating period

In the example shown in FIG. 7, the grating 131 has a chirped grating period, $\Lambda$, to broaden and flatten the grating reflectance spectrum. The chirped grating 131 can be implemented with a linearly or nonlinearly varying grating period, $\Lambda$, over the length of the grating. Alternatively, the grating 131 may be implemented with N sections of substantially constant grating period, $\Lambda_i$, each grating period $\Lambda_i$ having a slightly different value from those in its respective neighboring sections.

FIGS. 8A-8B schematically shows an optical mode respectively confined in an un-etched strip waveguide 134' and in the strip waveguide of FIG. 8A which has been etched to provide the grating 131. The waveguide 134 of FIG. 8B is formed by etching the waveguide of FIG. 8A to provide plural corrugations (only one of which is shown), thereby forming the grating 131. The corrugation in this example spaces two of the plurality of waveguides 150 forming the grating 131 by the grating period $\Lambda$ (or $\Lambda_i$).

Preferably, the reflectance spectrum of the chirped grating 131 is in the shape of a brick wall filter, e.g. having a filter width comparable to a channel spacing of a spectrometer configured for reception of the laser output. Such an idealized reflectance spectrum is shown in FIG. 9 as a function of wavelength. In this example, the reflectance spectrum follows a substantially rectangular profile instead of a Gaussian profile.

It should be noted that, it is also possible to provide the strip-waveguide grating with a constant grating period instead of the chirped grating period.

Figures 10, 11A, 11B:
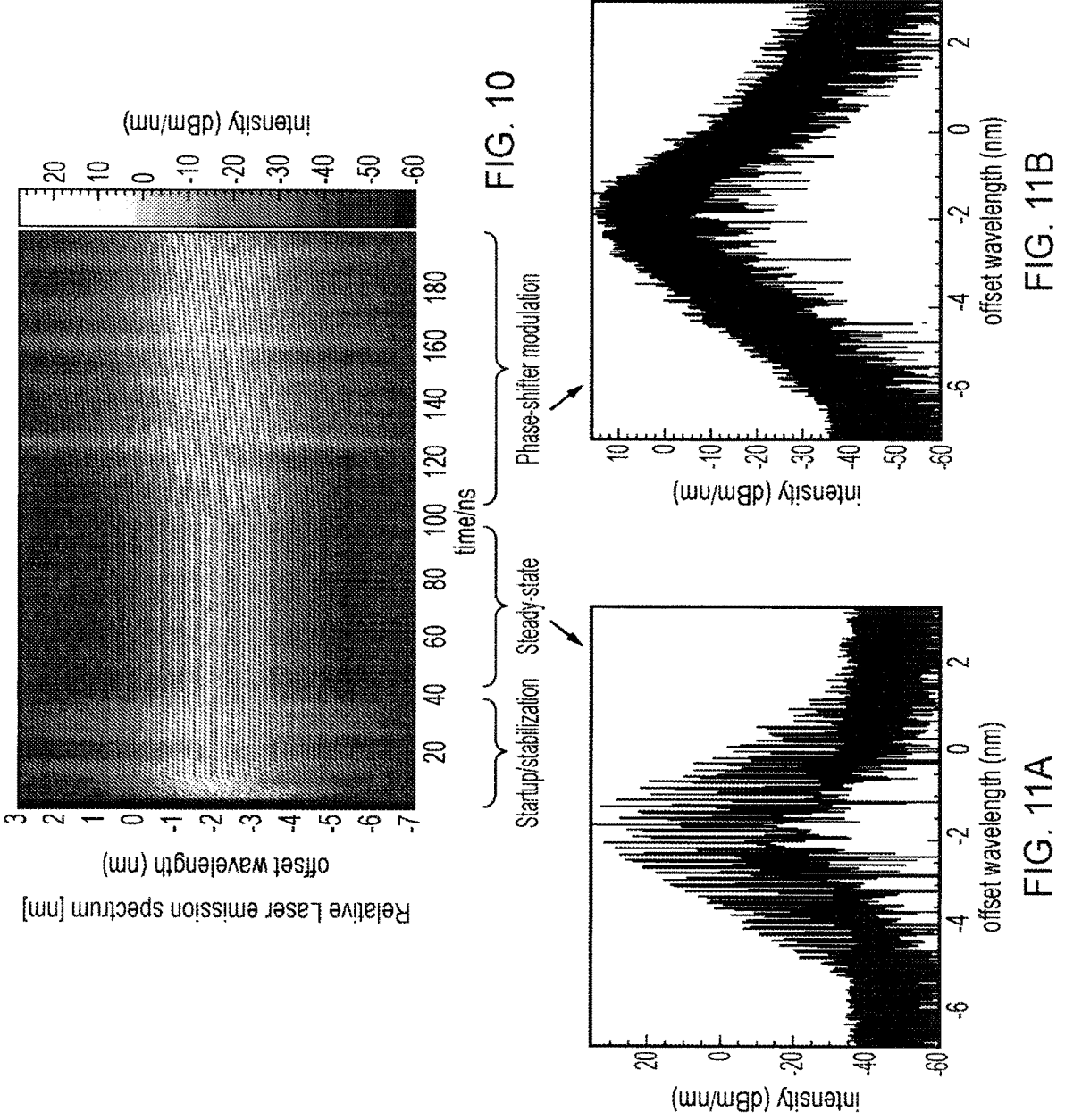
FIG. 10 shows a simulated time-evolution plot of a relative laser emission spectrum for a laser having the grating of FIG. 7.
FIGS. 11A-11B show snapshots in time of the relative laser emission spectrum of FIG. 10 respectively in the steady-state stage and in the phase-shifter modulation stage of laser operation.

Similarly to FIG. 5, FIG. 10 shows a simulated time-evolution plot of a relative laser emission spectrum for a laser 100 having the grating 131 of FIG. 7. FIGS. 11A-11B show snapshots in time of the relative laser emission spectrum of FIG. 10 respectively in the steady-state stage and in the phase-shifter modulation stage of laser operation. Again, the effect of the phase shifter 121 on the laser emission spectrum can be observed. After passing through the phase shifter, the spectrum is flattened, the spacings between the optical modes are reduced and the optical modes are distributed more uniformly over a spectrum corresponding to the reflectance spectrum of the grating 131. Compared to the emission spectrum shown in FIG. 6B, the spectrum shown in FIG. 11B is broader (spanning a larger range of offset wavelengths), the spacings between the optical modes are smaller and it is overall more uniform and more powerful. Thus, it can be concluded that it is more preferable to use a strip-waveguide grating (e.g. DBR) compared to a rib-waveguide grating.

Alternatively, it is envisaged that the broadband reflector 131 may not be realized as a grating. Generally, any reflector having a sufficiently wide bandwidth can be used as the second reflector forming the laser cavity 106. Alternative examples of broadband reflectors are discussed with reference to FIGS. 12A-15C below.

Referring to FIGS. 12A and 12B, in some examples a slot 232 in a waveguide 233 (e.g., a tapered transverse slot, as shown) may be used as a broadband reflector 131. The waveguide 233 is not particularly limited. For example, it may be a rib 137' or a strip 134' such the ones discussed above. At the slot 232, a first waveguide end or "facet" 234 may be square, and a second waveguide end or "facet" 236 may be angled, i.e., oblique to the waveguide, as shown. The first waveguide end may be on the laser cavity side of the broadband reflector 131 and the second waveguide end 236 may be on the output side of the broadband reflector. In operation, the discontinuity in refractive index at the first waveguide end 234 may cause light to be reflected back into the laser cavity 160. The oblique angle of the second waveguide end 236 may prevent reflections from the second waveguide end 236 from coupling back into the laser cavity 160. A dielectric thin film anti-reflection coating 238 may be formed on the second waveguide end 236 to reduce loss. The slot 232 may be filled with air or with a transparent material having an index of refraction less than that of silicon (which may have an index of refraction of about 3.5 in the wavelength range of interest) and greater than that of air; the presence of such a material may reduce the reflectance of the broadband reflector 131. The reflectance of the first waveguide end 234 may be between about 30% (if the slot 232 is filled with air) and about 15% (for a case in which the slot 232 is filled with a material having an index of refraction less than that of silicon and greater than that of air). The width of the slot 232 (i.e., the separation between the two waveguide ends) may be between 0.5 microns and 10 microns (e.g., between 2 microns and 4 microns) and the angle of the angled facet (i.e., the angle between a normal vector of the waveguide facet and the waveguide) may be between 6 degrees and 20 degrees (e.g., between 6 degrees and 12 degrees or between 6 degrees and 15 degrees).

Referring to FIGS. 13A and 13B, in some examples, the first waveguide end 234 may have a coating 240 that may be a single or multi-layer thin film dielectric coating, or a metal coating, to adjust the reflectance of the broadband reflector 131 over a larger range of values, e.g. down to 5% (for a suitable multi-layer dielectric coating) or up to more than 30% (for a metal coating). The metal coating may be sufficiently thin that the thickness (e.g., a few nanometers) is less than the skin depth in the metal at optical frequencies, such that a fraction of the incident light may be transmitted through the metal layer, and the thickness may be adjusted to produce the desired reflectance. Such a layer may be deposited, for example, with atomic layer deposition (ALD). The slot may be formed by etching, e.g., in the same fabrication steps used to form the waveguide, or in preceding or subsequent etching steps. The slot may extend all the way through the waveguide to e.g. a cladding layer (such as the BOX layer show in FIGS. 12B, 13B, 14C, 15C), or it may extend part-way down to the cladding layer, with the reflectance of the resulting broadband reflector 131 generally being lower, the less deeply the slot is etched. In some examples, the slot extends through at least half the total height (ht) of the waveguide; in some examples it extends through a fraction between 20.0% and 100.0% of the height of the waveguide. The waveguide may have a total height equal to the thickness (e.g., 3 microns) of the device layer (i.e. the layer disposed on top of the cladding layer). In the case of a rib waveguide, the total height may include the height (hs) of the slab and the height (hr) of the rib; in the case of a strip waveguide, the slab may be absent (or sufficiently thin to have little effect on the optical characteristics of the waveguide).

Figure 14A:
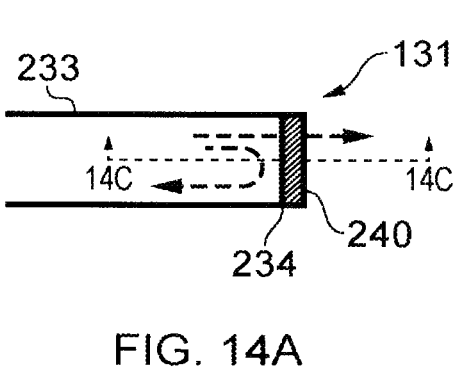
FIG. 14A is a top view of a broadband reflector.
Figure 14B:
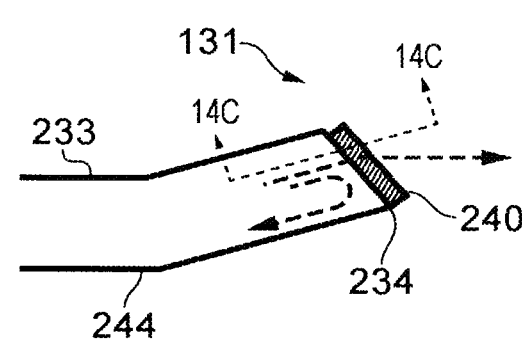
FIG. 14B is a top view of a variant of the broadband reflector of FIG. 14A.
Figure 14C:
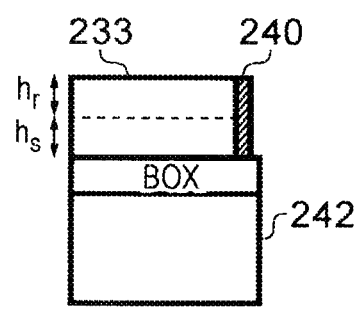
FIG. 14C is a cross-sectional view, along the line 14C-14C, of the broadband reflector of FIG. 14A or FIG. 14B.
Figure 15A:
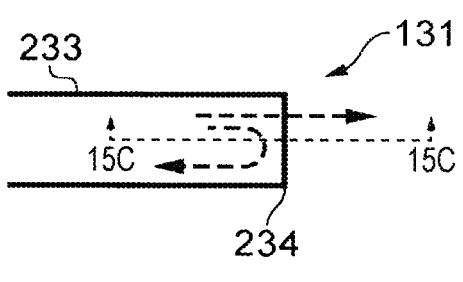
FIG. 15A is a top view of a broadband reflector.
Figure 15B:
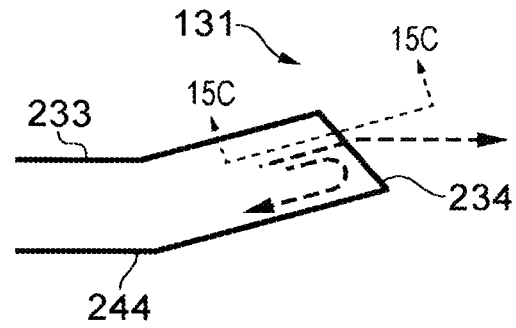
FIG. 15B is a top view of a variant of the broadband reflector of FIG. 15A.
Figure 15C:
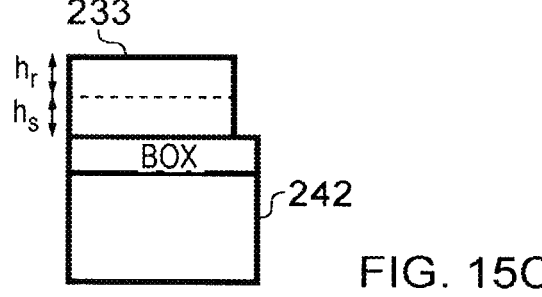
FIG. 15C is a cross-sectional view, along the line 15C-15C, of the broad band reflector of FIG. 15A or FIG. 15B.

In some examples, the portion of the waveguide 233 that is to the right of the slot 232 is removed from the examples of FIGS. 12A and 13A, and the broadband reflector 131 is, as a result, configured to launch light into free space. FIGS. 14A-15C show such examples, with (i) a waveguide facet that is perpendicular to the waveguide in the embodiments of FIGS. 14A and 15A, and that is oblique to the waveguide in the embodiments of FIGS. 14B and 15B and (ii) a coating 240 on the waveguide facet in the embodiments of FIGS. 14A-14C, and no coating on the waveguide facet in the embodiments of FIGS. 15A-15C. Any of the examples of FIGS. 14A-15C may include a waveguide bend 244 that (together with the facet angle, in the embodiments of FIGS. 14B and 15B) controls the direction of the launched light, e.g., with respect to the edge of the silicon photonics chip (so that, for example, even if the waveguide facet is oblique to the waveguide, the light may be launched in a direction parallel to the portion of the waveguide preceding the bend 244). FIG. 14C is a cross-sectional view, along the line 14C-14C, of the example of FIG. 14A or the example of FIG. 14B, and FIG. 15C is a cross-sectional view, along the line 15C-15C, of the example of FIG. 15A or the example of FIG. 15B. The broadband reflector 131 may be positioned at the edge 242 of the silicon photonics chip so that the light is launched in a direction away from the edge of the chip. In the embodiments of FIGS. 14B and 15B, the angle between the waveguide facet and a plane perpendicular to the waveguide (or, equivalently, the angle between a normal vector of the waveguide facet and the waveguide) may be between 0.1 degrees and 10.0 degrees. FIGS. 14B and 15B are not drawn to scale, and, for example, the angle of the facet (the angle between a normal vector of the waveguide facet and the waveguide) is exaggerated so as to be more readily perceptible. The facet angle or, in the embodiment of FIG. 14B, the design of the coating, may be selected so as to adjust the reflectance as a function of wavelength, e.g., over a wide bandwidth.

A further embodiment of a laser 200 according to the present invention is described below, with reference to FIG. 16. The two lasers 100, 200 have common features and as such, like features have like reference numerals.

Figure 16:
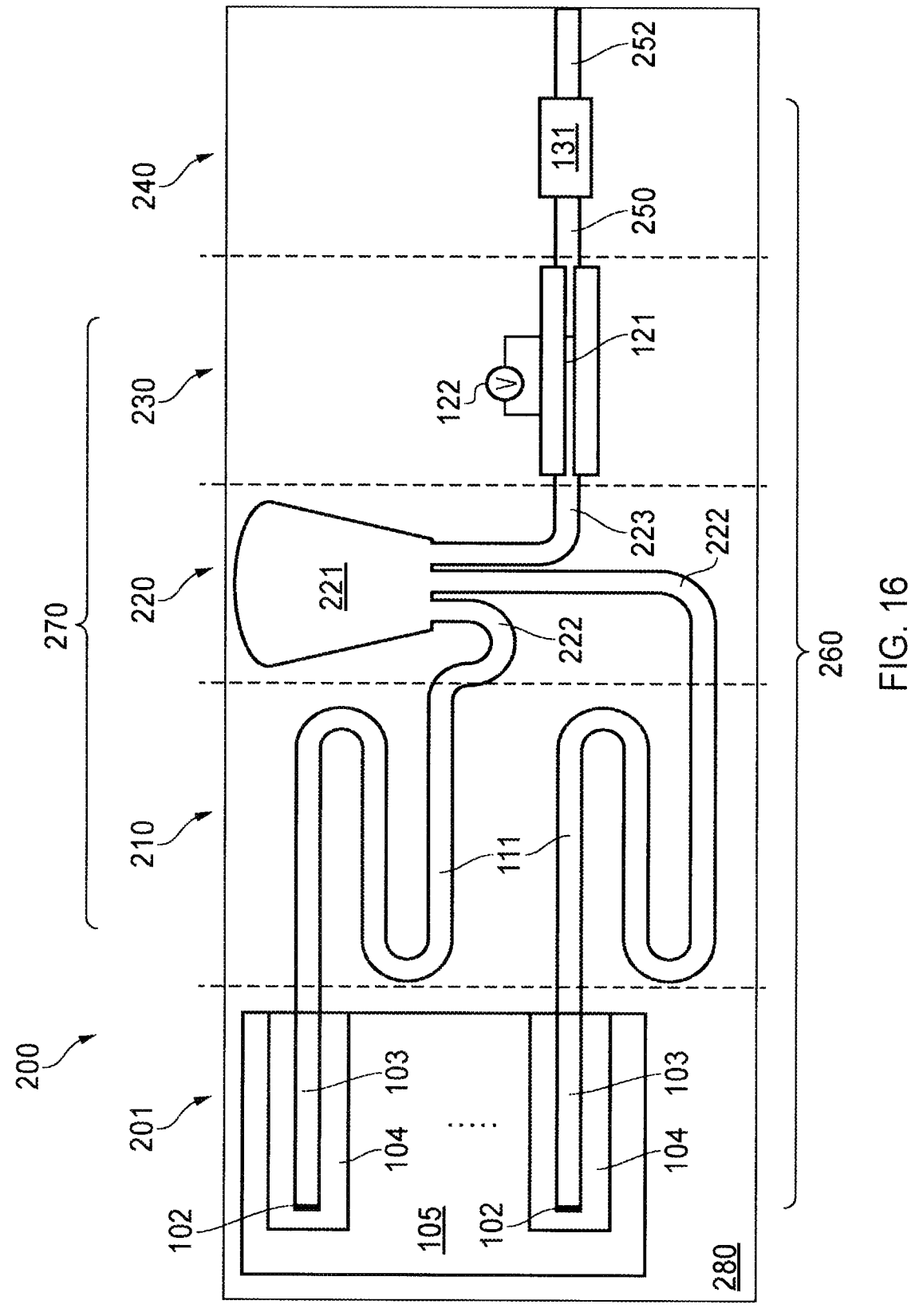
FIG. 16 schematically shows a laser including a plurality of gain regions and a multiplexer.

The laser 200 of FIG. 16 comprises a plurality of gain chips 104. The gain chips 104 each include a gain region 103 which in this example comprises an SOA waveguide and a first reflector 102 which may be formed as a HR surface on the end facet of the SOA waveguide. The gain chips 104 are located within one or more cavities 105 and are all located in the same region 201 on a shared PIC 280. The SOA waveguides 103 all feed into the intracavity modulation stage 270 which is shared. The SOA waveguides 103 are selected to lase at wavelengths that are different from one another, and lie within the reflectance spectrum of the broadband reflector 241 (i.e. the second reflector).

Each of the SOA waveguides 103 are connected to a respective delay line 111 such as the one shown in FIG. 1. The plurality of delay lines 111 are then connected to respective inputs 222 of a multiplexer 221. It is possible that the output from more than one delay line 111 is input into a shared input of the multiplexer. In this example, the length of each delay line 111 is 4 mm, although other lengths are envisaged.

In this embodiment, the multiplexer 221 is an Echelle grating, the Echelle grating also acting as a wavelength filter. The Echelle grating 221 is preferably configured such that the shape of the square of its channel transmission spectrum translates to a loss spectrum profile of the laser cavity, therefore producing a broader and flatter laser emission spectrum, similarly to the effect achieved by the gratings 131 of the examples above. An Echelle grating 221 can be manufactured within a SOI substrate with a high degree of accuracy due to the high index contrast of the SOI substrate which facilitates vertical etching. In this example, the passband of the Echelle grating 221 is configured to match a reflectance spectrum of the broadband reflector 241 having a FWHM greater than about 1 nm, and more preferably greater than about 3 nm. In some examples, the Echelle grating may include an MZI output for a flat-top passband. Alternative optical components may be used instead of an Echelle grating, for example, the multiplexer may be an AWG. However, AWGs can be more challenging to manufacture than Echelle gratings due to high-precision manufacturing requirements.

The output of the Echelle grating 221 is fed into a phase shifter 121 performing the same function as described for the phase shifting 121 of FIG. 1. The swept optical modes are partially reflected by the broadband reflector 241 and partially emitted as laser output.

The reflectance spectrum of the broadband reflector 241 is suitable for reflecting light from a plurality of input wavelengths arising from the plurality of SOA waveguides 103 that share the intracavity modulation stage 270.

An example of an Echelle grating 221 for use with one or more embodiments of the present invention is described below, with reference to FIGS. 17 and 18. The Echelle grating comprises a grating portion 142 curved at a radius of curvature R=595 μm. Light input 140 is supplied to the grating portion 141 and diffracted into multiplexed light output 141.

Figures 17, 18:
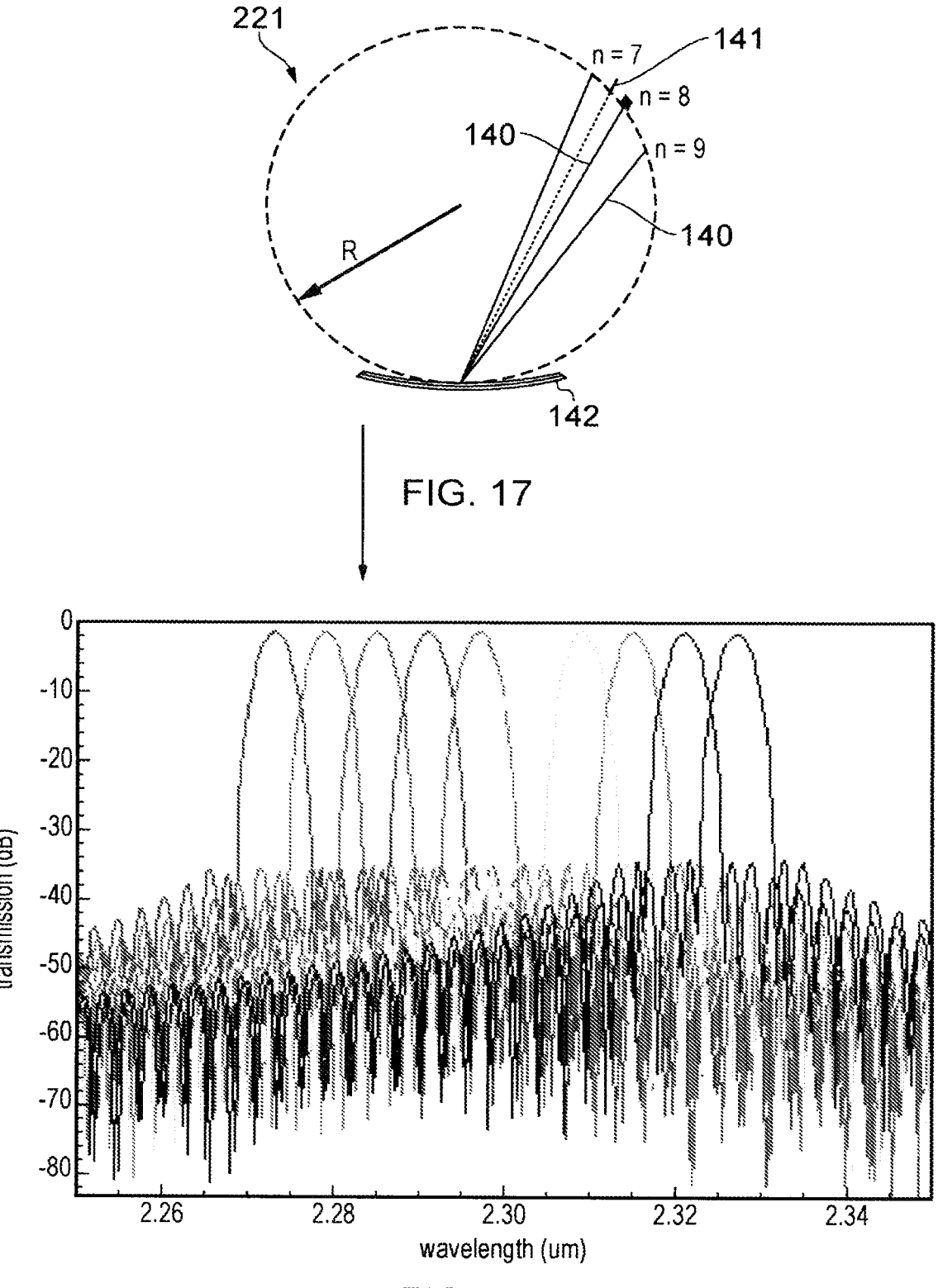
FIG. 17 schematically shows an Echelle grating.
FIG. 18 shows a plot of a transmission spectrum of the Echelle grating of FIG. 17 as a function of wavelength.

FIG. 18 shows a plot of a transmission spectrum of the Echelle grating of FIG. 17 as a function of wavelength. The transmission spectrum comprises a plurality of peaks. The laser cavity 260 can be selectively tuned to any one of the peaks in the grating's transmission spectrum to provide the wavelength filtering achieved by the Echelle grating 221. For example, the laser cavity may be selectively tuned to the central peak of the transmission spectrum using tuning provided by the phase shifter 121.

The broadband reflector 241 may be realized as any of the examples discussed with reference to FIGS. 12A-15C.

Conveniently, the mode suppression of the laser according to any of the examples above is relatively low, i.e. no more than 30 dB, or no more than 20 dB, or no more than 10 dB. Thus, multi-mode laser operation is achieved. Additionally, a broadened and more uniform laser emission spectrum is provided by the lasers 100, 200 of the examples above for improved spectroscopy performance in tissues and other highly-scattering media. In some examples, the laser emission spectrum may is as broad as 1000 nm in wavelength.

Although exemplary embodiments of a laser with an intracavity modulation stage for reducing coherence of the laser output, have been specifically described and illustrated herein, many modifications and variations will be apparent to those skilled in the art. Accordingly, it is to be understood that a laser with an intracavity modulation stage for reducing coherence of the laser output constructed according to principles of this invention may be embodied other than as specifically described herein. The invention is also defined in the following claims, and equivalents thereof.

What is claimed is:

1. A laser comprising a laser cavity defined by a first reflector and a second reflector, the laser cavity comprising:
   a gain region;
   an intracavity modulation stage for reducing coherence of the laser output,
   the intracavity modulation stage comprising a region configured to support a plurality of optical modes; and
   the second reflector is a broadband reflector having a reflectance spectrum configured to support the plurality of optical modes.

2. The laser of claim 1, wherein the gain region comprises one or more semiconductor optical amplifiers (SOAs).

3. The laser of claim 2, comprising a plurality of SOAs, each SOA having a different operating wavelength.

4. The laser of claim 2 wherein one or more of the SOA(s) comprises the first reflector such that it functions as a Reflective SOA (RSOA).

5. The laser of claim 1, wherein the gain region is a region of III-V material.

6. The laser of claim 1 wherein the intracavity modulation stage comprises a delay line.

7. The laser of claim 6, wherein the delay line is a silicon waveguide.

8. The laser of claim 6 wherein the delay line is a waveguide with an undulating path.

9. The laser of claim 1, wherein the intracavity modulation stage further comprises a phase shifter for dynamically shifting the wavelengths of the plurality of optical modes.

10. The laser of claim 9, wherein the phase shifter comprises a heater.

11. The laser of claim 9, wherein the phase shifter comprises a semiconductor junction.

12. The laser of claim 1, wherein the broadband reflector is a grating.

13. The laser of claim 12, wherein the grating is a DBR grating.

14. The laser of claim 13, wherein the grating has a chirped grating period.

15. The laser of claim 1, wherein a plurality of gain regions feed into the intracavity modulation stage, which is a shared intracavity modulation stage.

16. The laser of claim 15, wherein the reflectance spectrum of the broadband reflector is configured to reflect light from a plurality of input wavelengths arising from the plurality of gain regions that share the intracavity modulation stage.

17. The laser of claim 16, wherein light from the plurality of gain regions is multiplexed to the broadband reflector by a multiplexer.

18. The laser of claim 17, wherein the multiplexer is an Echelle grating, the Echelle grating also acting as a wavelength filter.

19. The laser of claim 1, wherein a mode suppression of the laser is no more than 30 dB, or no more than 20 dB, or no more than 10 dB.

20. A silicon photonics integrated circuit comprising the laser of claim 1.

* * * * *